United States Patent
Choi et al.

(10) Patent No.: US 11,069,396 B2
(45) Date of Patent: Jul. 20, 2021

(54) MEMORY DEVICE AND METHOD OF OPERATING THE MEMORY DEVICE FOR INITIALIZING SENSING LATCH DURING EVALUATION OPERATION

(71) Applicant: SK hynix Inc., Icheon-si (KR)

(72) Inventors: Hyung Jin Choi, Ulsan (KR); Sung Mook Lim, Anyang-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/874,236

(22) Filed: May 14, 2020

(65) Prior Publication Data

US 2021/0166747 A1    Jun. 3, 2021

(30) Foreign Application Priority Data

Dec. 3, 2019 (KR) .................. 10-2019-0158817

(51) Int. Cl.
| G11C 7/22 | (2006.01) |
| G11C 11/4072 | (2006.01) |
| G11C 11/4074 | (2006.01) |
| G11C 11/4091 | (2006.01) |
| G11C 7/20 | (2006.01) |

(Continued)

(52) U.S. Cl.
CPC ............ *G11C 11/4072* (2013.01); *G11C 7/06* (2013.01); *G11C 7/065* (2013.01); *G11C 7/1039* (2013.01); *G11C 7/20* (2013.01); *G11C 7/22* (2013.01); *G11C 11/4074* (2013.01); *G11C 11/4085* (2013.01); *G11C 11/4091* (2013.01); *G11C 11/4093* (2013.01); *G11C 11/4094* (2013.01);

(Continued)

(58) Field of Classification Search
CPC ....... G11C 16/0483; G11C 16/26; G11C 7/22; G11C 7/06; G11C 7/1039; G11C 7/1069; G11C 7/065; G11C 11/4072; G11C 11/4094; G11C 7/20; G11C 11/4093; G11C 11/4085; G11C 11/4091; G11C 11/4074

See application file for complete search history.

(56) References Cited

U.S. PATENT DOCUMENTS

| 2009/0141556 A1* | 6/2009 | Baik .................. G11C 16/34 365/185.19 |
| 2013/0163343 A1* | 6/2013 | Yang .................. G11C 16/26 365/185.21 |

(Continued)

FOREIGN PATENT DOCUMENTS

| KR | 100938084 B1 | 1/2010 |
| KR | 1020170098716 A | 8/2017 |

*Primary Examiner* — Mushfique Siddique
(74) *Attorney, Agent, or Firm* — William Park & Associates Ltd.

(57) ABSTRACT

Provided herein may be a memory device and a method of operating the memory device. The memory device includes a memory cell, a page buffer coupled to the memory cell through a bit line and configured to perform a read operation of sensing data stored in the memory cell, wherein the page buffer includes a data storage configured to store data sensed from the memory cell, the read operation includes a precharge period during which a precharge voltage is applied to the bit line, an evaluation period during which a state of the memory cell is incorporated into a voltage of the bit line, and a data storage period during which the data sensed through the bit line is stored in the data storage, and the data storage is initialized during the evaluation period.

20 Claims, 11 Drawing Sheets

(51) Int. Cl.
*G11C 11/4094* (2006.01)
*G11C 11/408* (2006.01)
*G11C 7/06* (2006.01)
*G11C 11/4093* (2006.01)
*G11C 16/26* (2006.01)
*G11C 16/04* (2006.01)
*G11C 7/10* (2006.01)

(52) U.S. Cl.
CPC .......... *G11C 16/0483* (2013.01); *G11C 16/26* (2013.01)

(56) References Cited

U.S. PATENT DOCUMENTS

| | | | |
|---|---|---|---|
| 2014/0347928 A1* | 11/2014 | Lee | G11C 16/0483 365/185.11 |
| 2017/0256309 A1* | 9/2017 | Yoon | G11C 11/5642 |
| 2019/0214092 A1* | 7/2019 | Jang | G11C 11/413 |
| 2019/0237145 A1* | 8/2019 | Jo | G11C 16/26 |
| 2019/0287629 A1* | 9/2019 | Bang | G11C 11/5642 |
| 2021/0005268 A1* | 1/2021 | Kim | H01L 24/05 |

* cited by examiner

MEMORY DEVICE AND METHOD OF OPERATING THE MEMORY DEVICE FOR INITIALIZING SENSING LATCH DURING EVALUATION OPERATION

CROSS-REFERENCE TO RELATED APPLICATION

The present application claims priority under 35 U.S.C. § 119(a) to Korean patent application number 10-2019-0158817 filed on Dec. 3, 2019, in the Korean Intellectual Property Office, the entire disclosure of which is incorporated herein by reference.

BACKGROUND

1. Technical Field

Various embodiments of the present disclosure generally relate to an electronic device, and more particularly, to a memory device and a method of operating the memory device.

2. Related Art

A storage device is a device which stores data. The storage device may include a memory device in which data is stored and a memory controller which controls the memory device. The memory device is a storage implemented using a semiconductor, such as silicon (Si), germanium (Ge), gallium arsenide (GaAs), or indium phosphide (InP). Memory devices are chiefly classified into a volatile memory device and a nonvolatile memory device.

The storage device may sense data stored in the memory device and store the sensed data. The sensing operation for sensing data may include a bit line precharge period, an evaluation period, a sensing latch initialization period, and a data storage period. In order to sense data stored in the memory device, a plurality of control signals may be generated. The volatile memory device is a memory device in which stored data is lost when power supply is interrupted. Representative examples of the volatile memory device include a static random access memory (SRAM), a dynamic RAM (DRAM), a synchronous DRAM (SDRAM), etc.

The nonvolatile memory device is a memory device in which stored data is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change RAM (PRAM), a magnetic RAM (MRAM), a resistive RAM (RRAM), a ferroelectric RAM (FRAM), etc. The flash memory is chiefly classified into a NOR type and a NAND type.

SUMMARY

An embodiment of the present disclosure may provide for a memory device. The memory device may include a memory cell, a page buffer coupled to the memory cell through a bit line and configured to perform a read operation of sensing data stored in the memory cell, and a reset controller configured to control a signal that is applied to the page buffer, wherein the page buffer may include a data storage configured to store data sensed from the memory cell, wherein the read operation may include a precharge period during which a precharge voltage is applied to the bit line, and an evaluation period during which a state of the memory cell is incorporated into a voltage of the bit line, and wherein the reset controller may control the data storage so that the data storage is initialized during the evaluation period.

An embodiment of the present disclosure may provide for a method of operating a memory device, the memory device including a memory cell and a page buffer coupled to the memory cell through a bit line. The method may include performing a precharge operation of applying a precharge voltage to the bit line, performing an evaluation operation of incorporating a state of the memory cell into a voltage of the bit line, and performing a data storage operation of storing sensed data corresponding to the state of the memory cell in a data storage included in the page buffer, wherein, at performing the evaluation operation, the data storage is initialized.

An embodiment of the present disclosure may provide for a storage device. The storage device may include a memory device including a memory cell, and a memory controller configured to control an operation of the memory device, wherein the memory device may include a latch configured to perform a sensing operation of sensing data stored in the memory cell and then store a result of sensing, and wherein the sensing operation may include an operation of applying a precharge voltage to a bit line coupled to the memory cell, incorporate a state of the memory cell into a voltage of the bit line, and initializing the latch while the state of the memory cell is incorporated into the voltage of the bit line.

An embodiment of the present disclosure may provide for a memory device. The memory device may include a memory cell and a page buffer coupled to the memory cell through a bit line and configured to perform a read operation of sensing data stored in the memory cell in response to page buffer control signals. The page buffer including a data storage configured to store data sensed from the memory cell. The read operation including a precharge period during which a precharge voltage is applied to the bit line and an evaluation period during which a state of the memory cell is incorporated into a voltage of the bit line. The data storage may be initialized during the evaluation period in response to the page buffer control signals.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Various embodiments of the present disclosure will now be described more fully hereinafter with reference to the accompanying drawings, in which preferred embodiments of the present disclosure are shown, so that those skilled in the art can easily practice the technical spirit of the present disclosure.

Various embodiments of the present disclosure may be directed to a memory device having improved read performance of memory cells and a method of operating the memory device.

Figure 1:
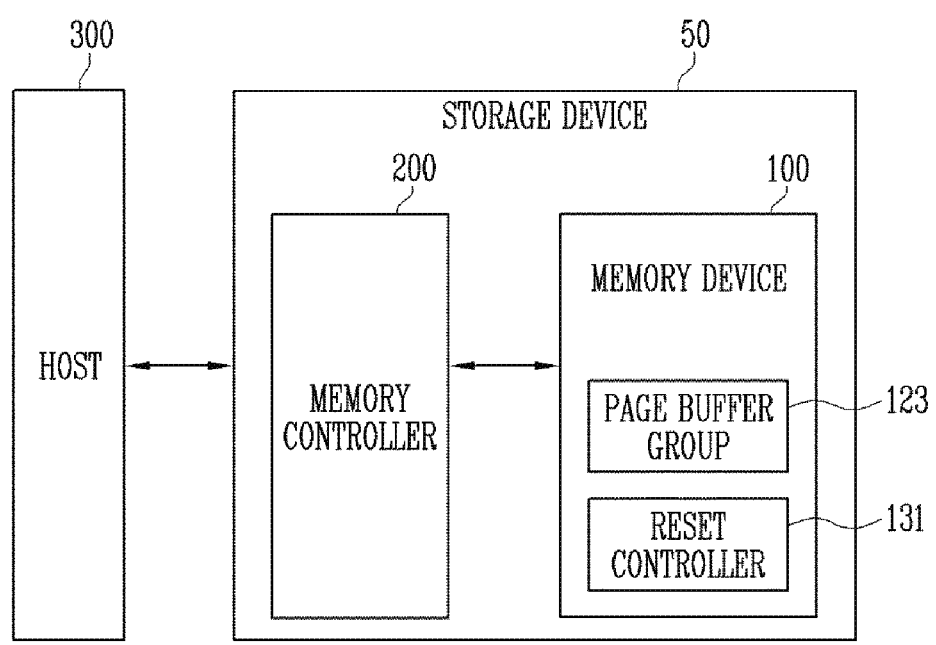
FIG. 1 is a block diagram illustrating a storage device according to an embodiment of the present disclosure.

FIG. 1 is a block diagram illustrating a storage device according to an embodiment of the present disclosure.

Referring to FIG. 1, a storage device 50 may include a memory device 100 and a memory controller 200 which controls the operation of the memory device.

The storage device 50 may be a device which stores data under the control of a host 300, such as a mobile phone, a smartphone, an MP3 player, a laptop computer, a desktop computer, a game console, a TV, a tablet PC, or an in-vehicle infotainment system.

The storage device 50 may be manufactured as any one of various types of storage devices depending on a host interface which is a communication method with the host 300. For example, the storage device 50 may be implemented as any one of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data.

Each of the memory cells may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. A single memory block may include a plurality of pages. In an embodiment, each page may be a unit by which data is stored in the memory device 100 or by which data stored in the memory device 100 is read. A memory block may be a unit by which data is erased.

In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on the assumption that the memory device 100 is a NAND flash memory.

The memory device 100 may receive a command and an address from the memory controller 200. The memory device 100 may access an area, selected by the received address, in the memory cell array. Accessing the selected area may mean that an operation corresponding to the received command is performed on the selected area. For example, the memory device 100 may perform a write operation (i.e., a program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

In an embodiment of the present disclosure, the memory device 100 may include a page buffer group 123 and a reset controller 131.

The page buffer group 123 may temporarily store data to be programmed to a memory cell included in the memory device 100, or may sense the data stored in the memory cell and store the sensed data.

The reset controller 131 may control various control signals that are applied to sense the data stored in the memory cell. In an embodiment, the operation of sensing the data stored in the memory device may include a bit line precharge period, an evaluation period, a sensing latch initialization period, and a data storage period. The reset controller 131 may control the corresponding control signals so that a sensing latch is initialized during the evaluation operation, in order to reduce the time required for the data sensing operation. The above-described data sensing operation may be identical or equivalent to a sensing operation or read operation, which will be described later.

An operation of the reset controller 131 according to the memory device and a method of operating the memory device in accordance with an embodiment of the present disclosure will be described with reference to the following drawings.

The memory controller 200 may control the overall operation of the storage device 50.

When power is applied to the storage device 50, the memory controller 200 may run firmware (FW). The firmware (FW) may include a host interface layer (HIL) which receives a request input from the host 300 or outputs a response to the host 300, a flash translation layer (FTL) which manages an operation between the interface of the host 300 and the interface of the memory device 100, and a flash interface layer (FIL) which provides a command to the memory device 100 or receives a response from the memory device 100.

The memory controller 200 may receive data and a logical address (LA) from the host 300, and may translate the logical address into a physical address (PA) indicating the address of memory cells which are included in the memory device 100 and in which data is to be stored. The logical address may be a logical block address (LBA), and the physical address may be a physical block address (PBA).

The memory controller 200 may control the memory device 100 so that a program operation, a read operation or an erase operation is performed in response to a request received from the host 300. During the program operation, the memory controller 200 may provide a program command, a physical block address, and data to the memory device 100. During the read operation, the memory controller 200 may provide a read command and a physical block address to the memory device 100. During the erase operation, the memory controller 200 may provide an erase command and a physical block address to the memory device 100.

In an embodiment, the memory controller 200 may control the memory device 100 so that a program operation, a read operation or an erase operation is autonomously performed regardless of a request received from the host 300. For example, the memory controller 200 may control the memory device 100 so that a program operation, a read operation or an erase operation to be used to perform background operations, such as wear leveling, garbage collection, and read reclaim operations, is performed.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
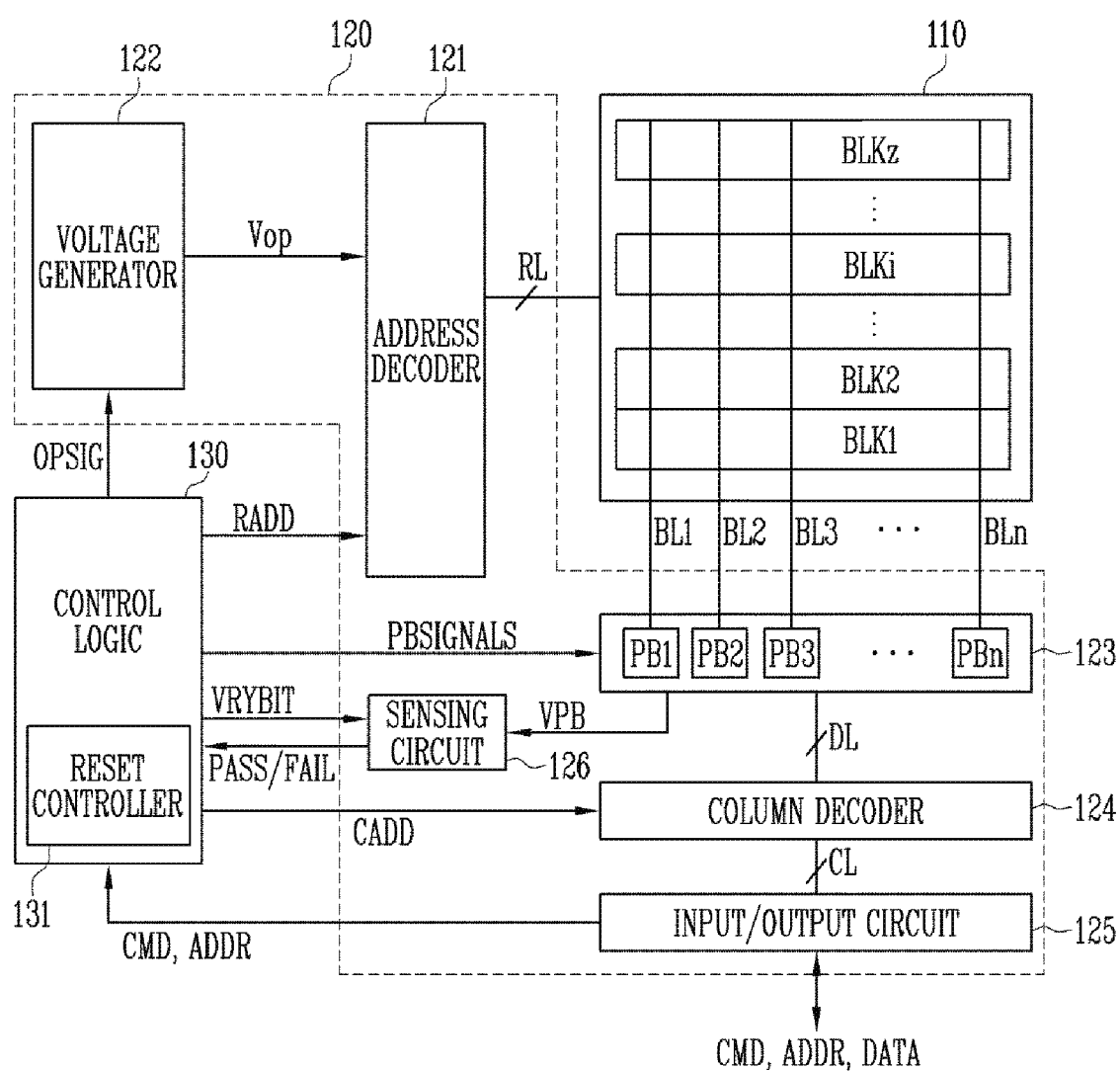
FIG. 2 is a diagram illustrating a memory device according to an embodiment of the present disclosure.

FIG. 2 is a diagram illustrating the memory device 100 according to an embodiment of the present disclosure.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are coupled to an address decoder 121 through row lines RL. Each of the memory blocks BLK1 to BLKz may be coupled to a page buffer group 123 through bit lines BL1 to BLn. Each of the memory blocks BLK1 to BLKz includes a plurality of memory cells. In an embodiment, the plurality of memory cells may be nonvolatile memory cells. Memory cells coupled to the same word line may be defined as a single page. That is, the memory cell array 110 may include a plurality of physical pages. Therefore, a single memory block may include a plurality of pages.

Each of the memory cells included in the memory cell array 110 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may perform a program operation, a read operation, or an erase operation on a selected area of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the address decoder 121, a voltage generator 122, the page buffer group 123, a column decoder 124, an input/output circuit 125, and a sensing circuit 126.

The peripheral circuit 120 may drive the memory cell array 110. For example, the peripheral circuit 120 may drive the memory cell array 110 so as to perform a program operation, a read operation, and an erase operation.

The address decoder 121 is coupled to the memory cell array 110 through the row lines RL. The row lines RL may include the at least one source select line, the plurality of word lines, and the at least one drain select line. In an embodiment, the word lines may include normal word lines and dummy word lines. The row lines RL may further include a pipe select line.

The address decoder 121 may be operated under the control of the control logic 130. The address decoder 121 may receive a row address RADD from the control logic 130.

The address decoder 121 may decode the row address RADD received from the control logic 130. The address decoder 121 selects at least one of the memory blocks BLK1 to BLKz according to the decoded address. Further, the address decoder 121 may select at least one word line WL of the selected memory block so that voltages generated by the voltage generator 122 are applied to the at least one word line WL according to the decoded address.

For example, during a program operation, the address decoder 121 may apply a program voltage to a selected word line and apply a program pass voltage having a level lower than that of the program voltage to unselected word lines. During a program verify operation, the address decoder 121 may apply a verify voltage to a selected word line and apply a verify pass voltage higher than the verify voltage to unselected word lines. During a read operation, the address decoder 121 may apply a read voltage to a selected word line and apply a read pass voltage higher than the read voltage to unselected word lines.

In an embodiment, the erase operation of the memory device 100 is performed on a memory block basis. During an erase operation, the address decoder 121 may select one memory block according to the decoded address. During the erase operation, the address decoder 121 may apply a ground voltage to word lines coupled to the selected memory block.

The voltage generator 122 may be operated under the control of the control logic 130. The voltage generator 122 may generate a plurality of voltages using an external supply voltage provided to the memory device. For example, the voltage generator 122 may generate various operating voltages Vop that are used for program, read, and erase operations in response to an operation signal OPSIG. For example, the voltage generator 122 may generate a program voltage, a verify voltage, a pass voltages, a read voltage, an erase voltage, etc. under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate a plurality of voltages using the external supply voltage or the internal supply voltage.

For example, the voltage generator 122 may include a plurality of pumping capacitors for receiving the internal supply voltage and generate a plurality of voltages by selectively enabling the plurality of pumping capacitors under the control of the control logic 130.

The generated voltages may be supplied to the memory cell array 110 by the address decoder 121.

The page buffer group 123 includes first to n-th page buffers PB1 to PBn. The first to n-th page buffers PB1 to PBn are coupled to the memory cell array 110 through the first to n-th bit lines BL1 to BLn. The first to n-th page buffers PB1 to PBn are operated under the control of the control logic 130. For example, the first to n-th page buffers PB1 to PBn may be operated in response to page buffer control signals PBSIGNALS. For example, the first to n-th page buffers PB1 to PBn may temporarily store data received through the first to n-th bit lines BL1 to BLn or may sense voltages or currents of the bit lines BL1 to BLn during a read operation or verify operation.

For example, during a program operation, when a program pulse is applied to a selected word line, the first to n-th page buffers PB1 to PBn may transfer data DATA, received through the input/output circuit 125, to selected memory cells through the first to n-th bit lines BL1 to BLn. The memory cells in the selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibit voltage (for example, a supply voltage) is applied may be maintained. During a program verify operation, the first to n-th page buffers PB1 to PBn may read page data from the selected memory cells through the first to n-th bit lines BL1 to BLn.

During a read operation, the first to n-th page buffers PB1 to PBn may read data DATA from the memory cells in the selected page through the first to n-th bit lines BL1 to BLn, and may output the read data DATA to the input/output circuit 125 under the control of the column decoder 124.

During the erase operation, the first to n-th page buffers PB1 to PBn may allow the first to n-th bit lines BL1 to BLn to float.

The column decoder 124 may transfer data between the input/output circuit 125 and the page buffer group 123 in response to a column address CADD. For example, the column decoder 124 may exchange data with the first to n-th page buffers PB1 to PBn through data lines DL or may exchange data with the input/output circuit 125 through column lines CL.

The input/output circuit 125 may transfer a command CMD and an address ADDR, received from the memory controller 200, described with reference to FIG. 1, to the control logic 130, or may exchange the data DATA with the column decoder 124.

During a read operation or a verify operation, the sensing circuit 126 may generate a reference current in response to an enable bit VRYBIT, and may compare a sensing voltage VPB received from the page buffer group 123 with a reference voltage generated using the reference current and then output a pass signal PASS or a fail signal FAIL.

The control logic 130 may control the peripheral circuit 120 by outputting the operation signal OPSIG, the row address RADD, the page buffer control signals PBSIGNALS, and the enable bit VRYBIT in response to the command CMD and the address ADDR. In addition, the control logic 130 may determine whether the verify operation has passed or failed in response to the pass or fail signal PASS or FAIL.

Figure 3:
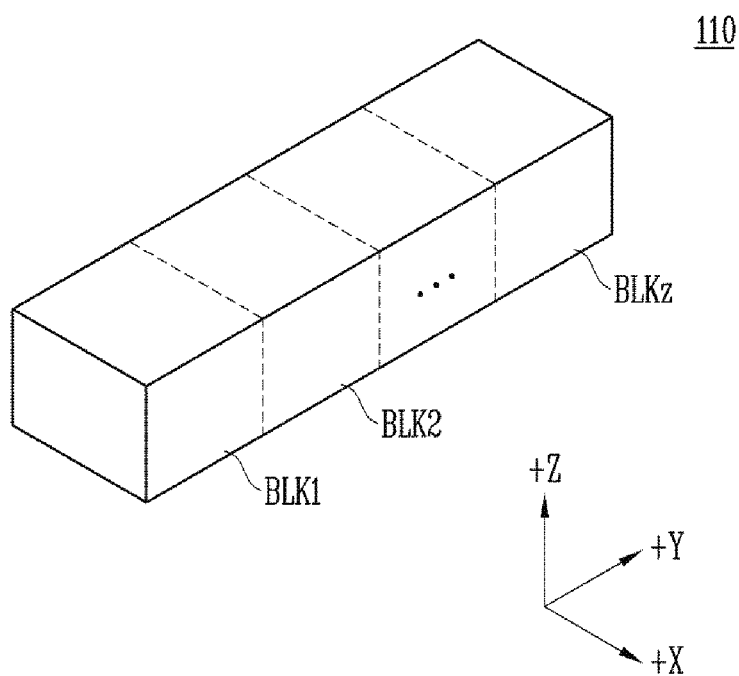
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional (3D) structure. Each memory block includes a plurality of memory cells stacked on a substrate. Such memory cells are arranged in a positive X (+X) direction, a positive Y (+Y) direction, and a positive Z (+Z) direction. The structure of each memory block will be described below with reference to FIGS. 4 and 5.

Figure 4:
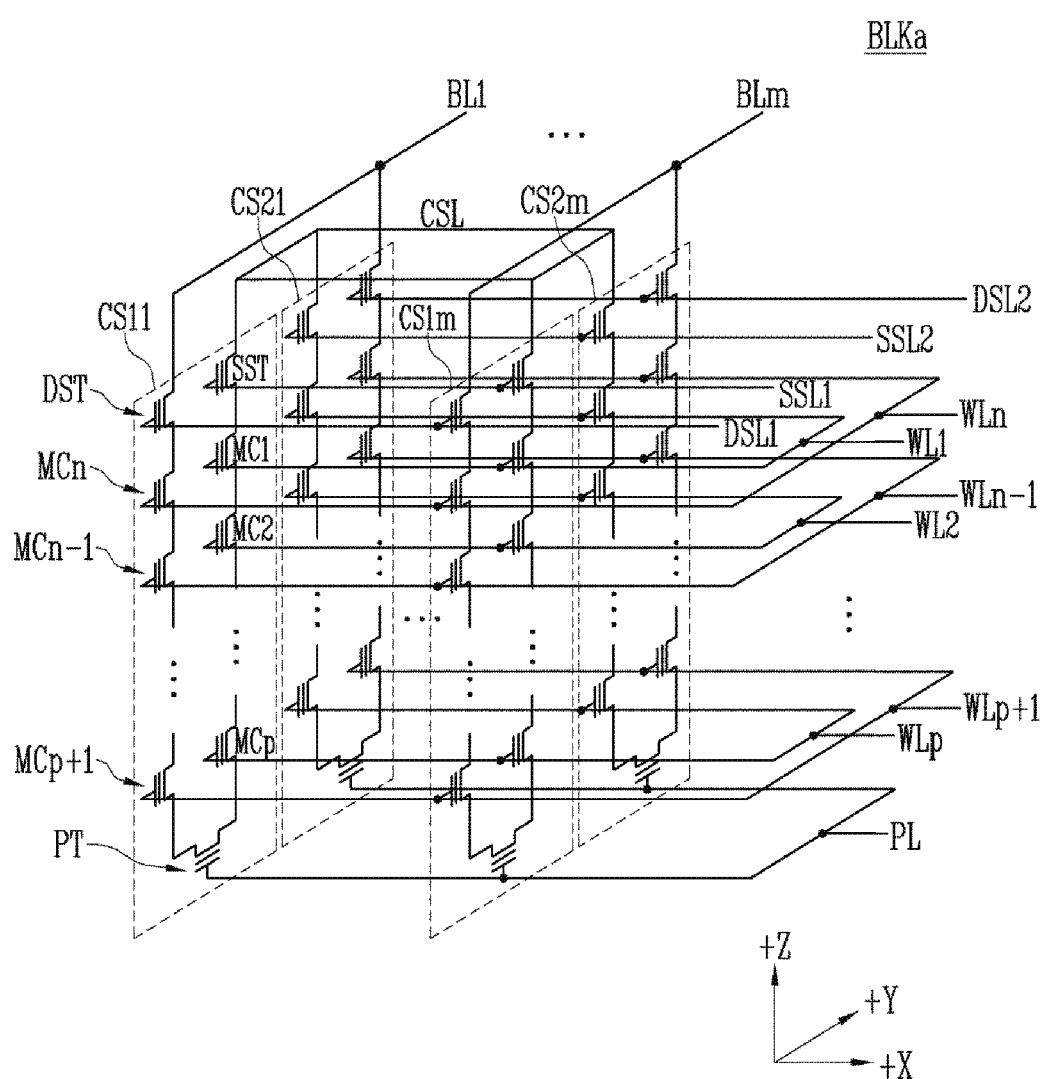
FIG. 4 is a circuit diagram illustrating any one memory block BLKa of memory blocks BLK1 to BLKz of FIG. 3.

FIG. 4 is a circuit diagram illustrating any one memory block BLKa of memory blocks BLK1 to BLKz of FIG. 3.

Referring to FIG. 4, the memory block BLKa includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings are arranged in a row direction (i.e. a positive (+) X direction). In FIG. 4, two cell strings are illustrated as being arranged in a column direction (i.e. a positive (+) Y direction). However, this illustration is made for convenience of description, and it will be understood that three or more cell strings may be arranged in the column direction.

In an embodiment, a single memory block may include a plurality of sub-blocks. A single sub-block may include cell strings arranged in a 'U' shape in a single column.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 4, source select transistors of cell strings CS11 to CS1$m$ in a first row are coupled to a first source select line SSL1. The source select transistors of cell strings CS21 to CS2$m$ in a second row are coupled to a second source select line SSL2.

In an embodiment, source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are coupled in series between the source select transistor SST and the pipe transistor PT. The p+1-th to n-th memory cells MCp+1 to MCn are sequentially arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is coupled between the corresponding bit line and the memory cells MCp+1 to MCn. The cell strings in a row direction are coupled to drain select lines extending in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extending in a column direction. In FIG. 4, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form an additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, instead of the first to m-th bit lines BL1 to BLm, even bit lines and odd bit lines may be provided. Further, even-numbered cell strings, among the cell strings CS11 to CS1m or CS21 to CS2m arranged in the row direction, may be coupled to respective even bit lines. Odd-numbered cell strings, among the cell strings CS11 to CS1m or CS21 to CS2m arranged in the row direction, may be coupled to respective odd bit lines.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells is controlled by the voltages that are applied to the dummy word lines coupled to respective dummy memory cells, and thus the dummy memory cells may have required threshold voltages.

Figure 5:
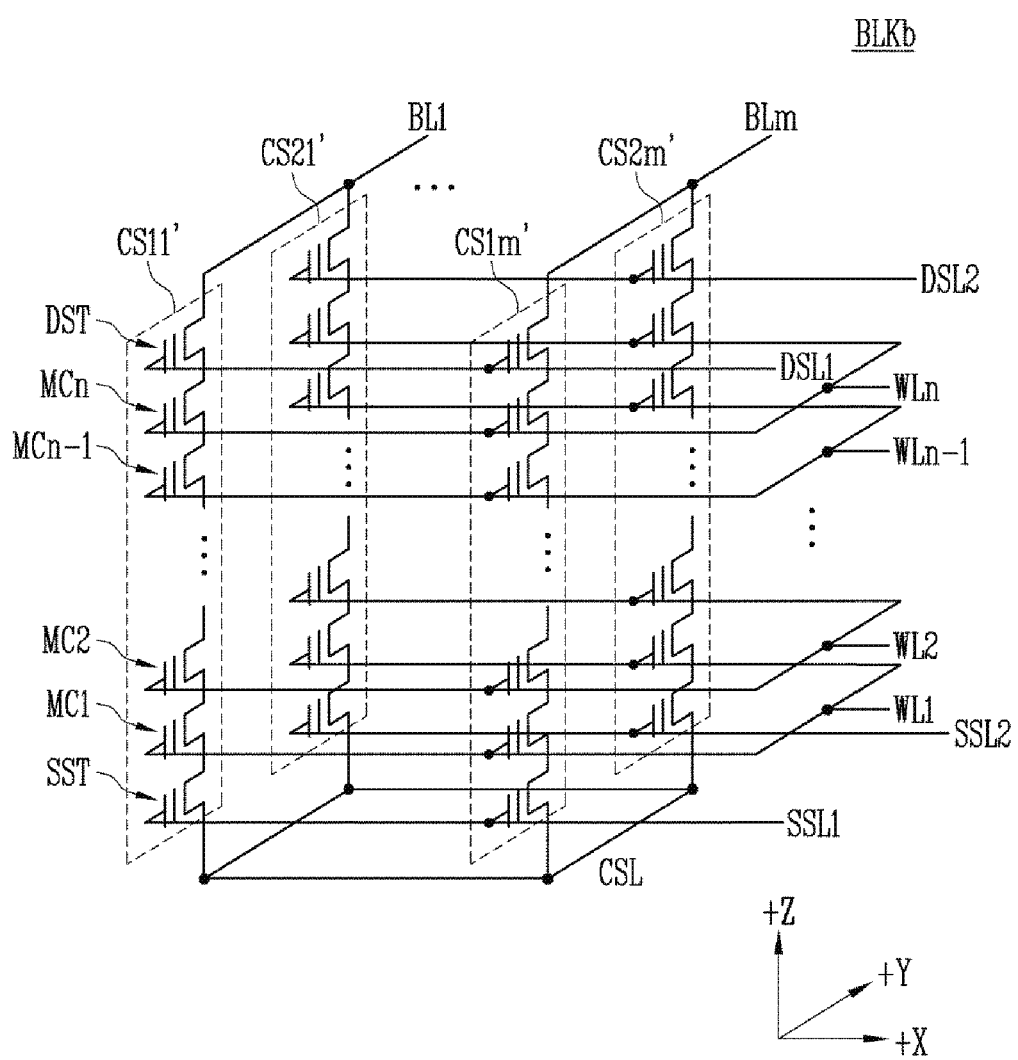
FIG. 5 is a circuit diagram illustrating an example of any one memory block BLKb of the memory blocks BLK1 to BLKz of FIG. 3.

FIG. 5 is a circuit diagram illustrating an example of any one memory block BLKb of the memory blocks BLK1 to BLKz of FIG. 3.

Referring to FIG. 5, the memory block BLKb may include a plurality of cell strings CS11' to CS1m' and CS21' to CS2m'. Each of the cell strings CS11' to CS1m' and CS21' to CS2m' extends in a positive (+) Z direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

In an embodiment, a single memory block may include a plurality of sub-blocks. A single sub-block may include cell strings arranged in an 'I' shape in a single column.

The source select transistor SST of each cell string is coupled between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. The gates of the first to n-th memory cells MC1 to MCn are coupled to first to n-th word lines WL1 to WLn, respectively.

The drain select transistor DST of each cell string is coupled between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 5 has an equivalent circuit similar to that of the memory block BLKa of FIG. 4 except that a pipe transistor PT is excluded from each cell string.

In an embodiment, instead of the first to m-th bit lines BL1 to BLm, even bit lines and odd bit lines may be provided. Further, even-numbered cell strings, among the cell strings CS11' to CS1m' or CS21' to CS2m' arranged in the row direction, may be coupled to respective even bit lines. Odd-numbered cell strings, among the cell strings CS11' to CS1m' or CS21' to CS2m' arranged in the row direction, may be coupled to respective odd bit lines.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As the number of dummy memory cells that are provided increases, the reliability of operation of the memory block BLKb may be improved, whereas the size of the memory block BLKb may increase. As the number of dummy memory cells that are provided decreases, the size of the memory block BLKb may decrease, whereas the reliability of operation of the memory block BLKb may be deteriorated.

In order to efficiently control the one or more dummy memory cells, respective dummy memory cells may have required threshold voltages. Before or after an erase operation on the memory block BLKb is performed, program operations may be performed on all or some of the dummy memory cells. When the erase operation is performed after the program operations have been performed, the dummy memory cells may have required threshold voltages by controlling voltages to be applied to dummy word lines coupled to respective dummy memory cells.

Figure 6:
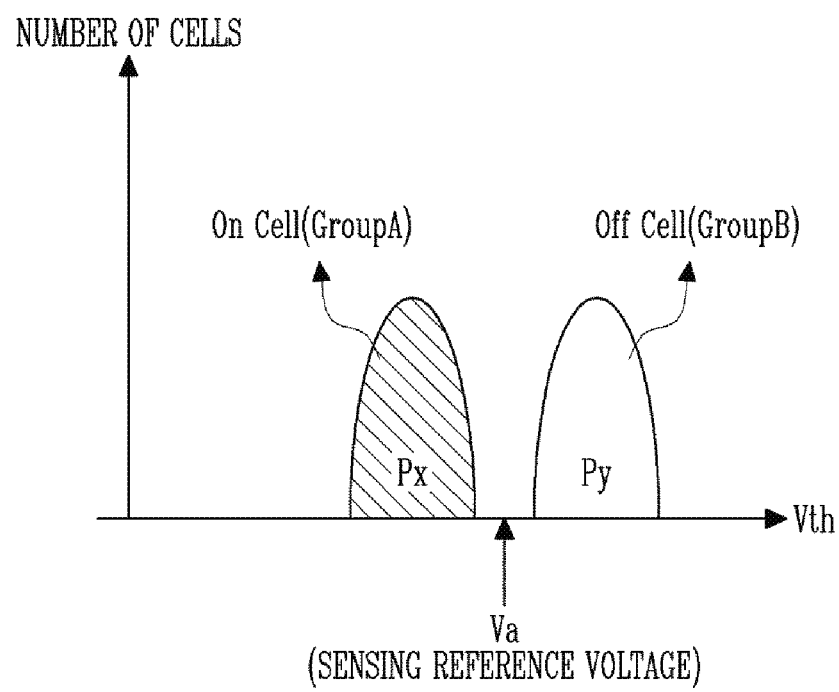
FIG. 6 is a diagram for explaining an operation of sensing data stored in memory cells.

FIG. 6 is a diagram for explaining an operation of sensing data stored in memory cells MC.

Referring to FIG. 6, a plurality of memory cells coupled to a single word line may form various program states (Px, Py) through a program operation. As a program voltage is applied, threshold voltages of memory cells may gradually increase from an erased state (not illustrated).

For example, it is assumed that, as the program operation is performed, the threshold voltage distributions of memory cells belonging to group A correspond to the first program state Px, and the threshold voltage distributions of memory cells belonging to group B correspond to the second program state Py. Further, when memory cells are sensed using a sensing reference voltage Va, current may flow through the memory cells belonging to group A, in which threshold voltages thereof are lower than the sensing reference voltage Va. That is, the memory cells belonging to group A may be determined to be on cells. Meanwhile, current may not flow through the memory cells belonging to group B in which threshold voltages thereof are higher than the sensing reference voltage Va. That is, the memory cells belonging to group B may be determined to be off cells.

Figure 7:
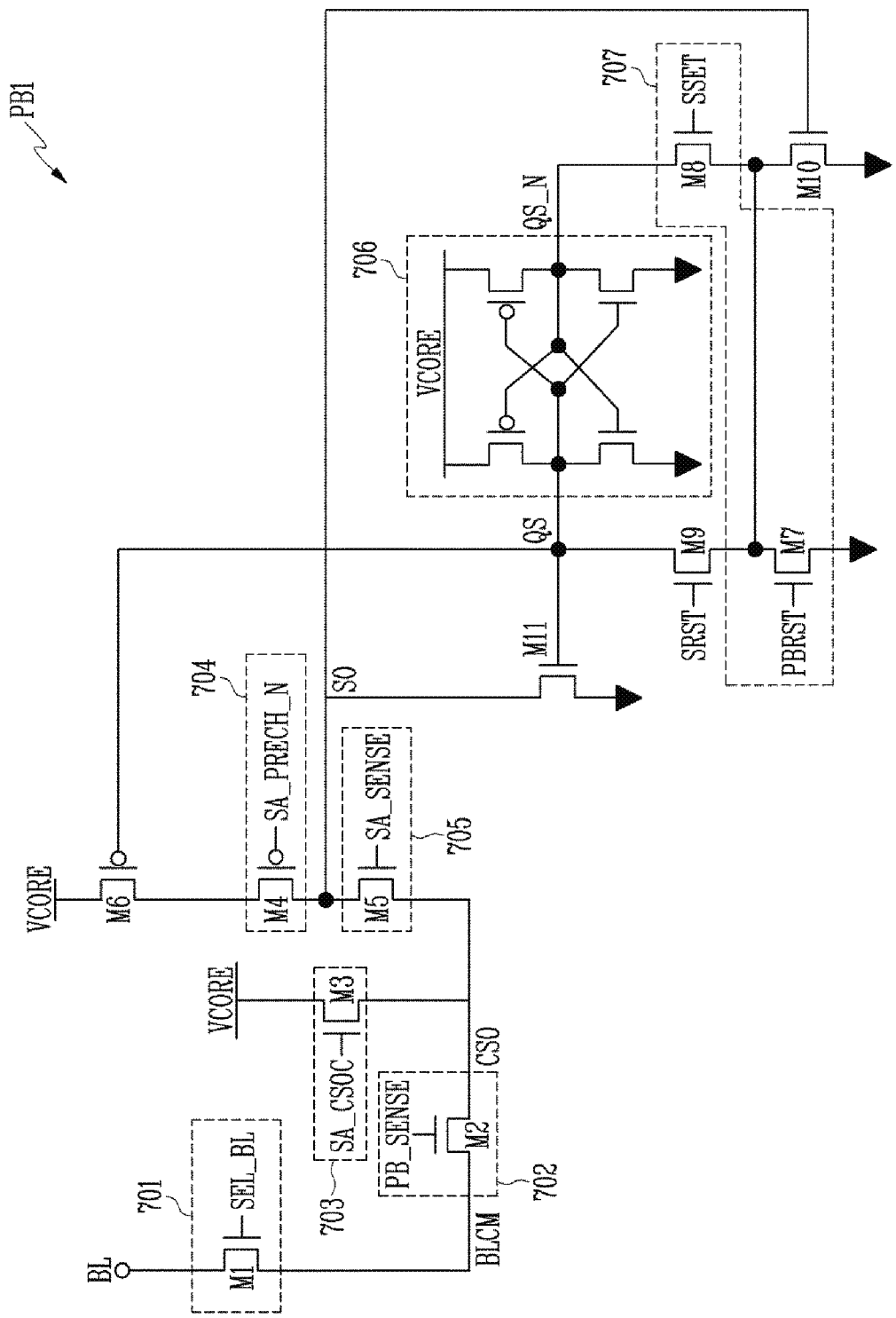
FIG. 7 is a diagram illustrating a page buffer according to an embodiment.

FIG. 7 is a diagram illustrating a page buffer according to an embodiment.

Figure 8:
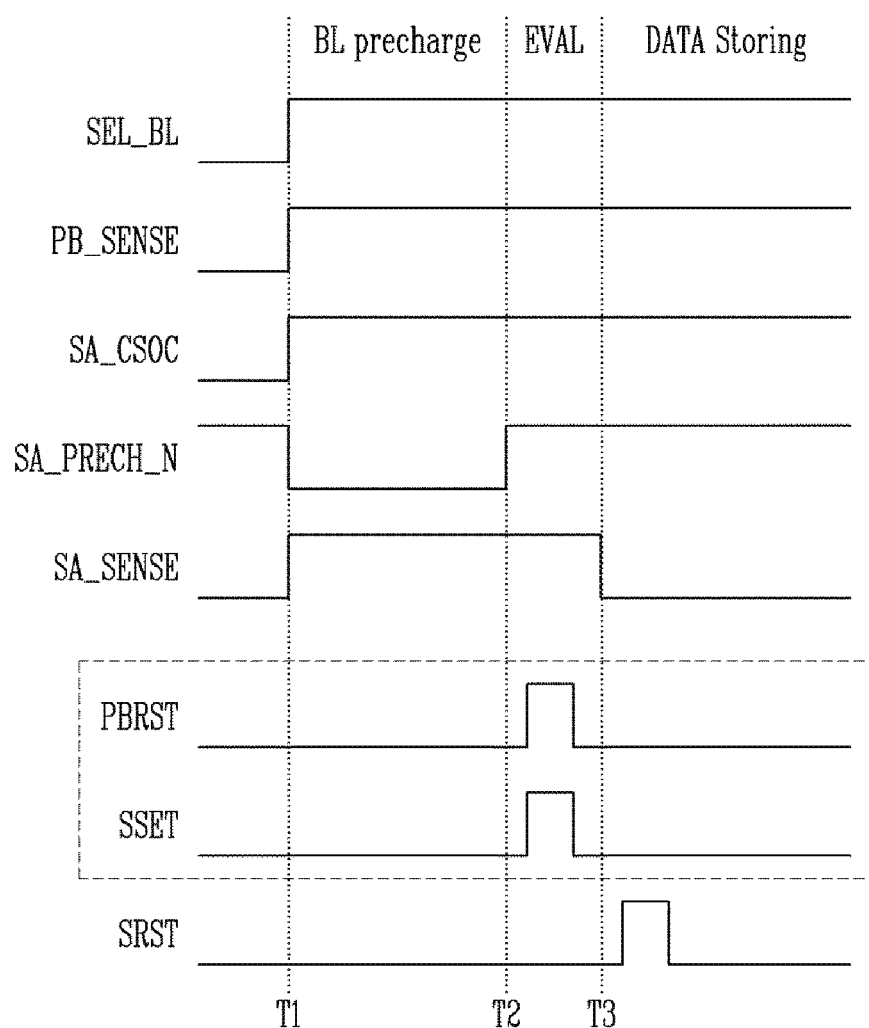
FIG. 8 is a timing diagram for explaining signals applied to the page buffer of FIG. 7.

FIG. 8 is a timing diagram for explaining signals applied to the page buffer of FIG. 7.

Referring to FIG. 7, a page buffer PB1 included in the page buffer group 123, described above with reference to FIG. 2, is described by way of example. The plurality of page buffers PB1 to PBn may be configured similarly to each other.

The page buffer PB1 may be operated in response to page buffer control signals PBSIGNALS received from the control logic 130. Signals SEL_BL, PB_SENSE, SA_CSOC, SA_PRECH_N, SA_SENSE, TRANS, PBRST, SSET, and SRST, which will be described later, may be included in the page buffer control signals PBSIGNALS output from the control logic 130.

An operation of sensing a memory cell MC may be performed using the page buffer PB1 coupled to the memory cell MC through a bit line BL. Referring to FIG. 6, the bit line BL coupled to any one memory cell MC, among a plurality of memory cells included in the memory cell array, is illustrated for convenience of description. Other bit lines may have configurations identical or equivalent to the configuration, which will be described below, and the number of bit lines is not limited to embodiments.

The operation of sensing data stored in the memory cell MC may be performed in various operations of the memory device. The operation of sensing the data stored in the memory cell MC may be an operation of sensing the state of a threshold voltage of the memory cell MC. In an example, when a program operation is performed on the memory cell MC included in the memory device and a program verify operation of verifying whether the program operation has passed or failed is performed, the operation of sensing the memory cell MC may be performed. In an example, when an erase operation is performed on the memory cell MC included in the memory device and an erase verify operation of verifying whether the erase operation has passed or failed is performed, the operation of sensing the memory cell MC may be performed. In an example, an operation of reading the data stored in the memory cell MC using the threshold voltage of the memory cell MC may include the operation of sensing the memory cell MC. An embodiment of the present disclosure is not limited to the operation type of the memory device, and may be applied to various operations of sensing the data stored in the memory cell MC.

Referring to FIG. 7, the page buffer PB1 may be coupled to the memory cell MC through the bit line BL. The page buffer PB1 may include first to tenth transistors M1 to M10 and a data storage 706. Here, the first to third transistors M1 to M3, the fifth transistor M5, and the eighth to tenth transistors M8 to M10 may be NMOS transistors. The fourth transistor M4 and the sixth transistor M6 may be PMOS transistors. Each of the transistors may be turned on or off in response to a signal applied to a gate thereof. In an embodiment, the data storage 706 may include a latch circuit.

The page buffer PB1 may include a bit line coupler 701, a page buffer sensor 702, a sensing controller 703, a precharge controller 704, a sensing node coupler 705, a data storage 706, and a data storage reset component 707. The page buffer PB1 may include a second sensing node SO, a first sensing node CSO, and a bit line coupling node BLCM. The second sensing node SO may be a node to which the bit line BL and the data storage 706 are coupled. The first sensing node CSO may be a node to which the page buffer sensor 702, the sensing controller 703, and the sensing node coupler 705 are coupled in common. The bit line coupling node BLCM may be a node which couples the bit line coupler 701 to the page buffer sensor 702.

The bit line BL coupled to the memory cell MC on which a read operation is performed may be coupled to the page buffer PB1 through the bit line coupler 701. The bit line coupler 701 may be coupled between the bit line BL and the bit line coupling node BLCM. The bit line coupler 701 may include the first transistor M1 that is controlled in response to a bit line select signal SEL_BL. The first transistor M1 may be implemented as an NMOS transistor that is turned on or off in response to the bit line select signal SEL_BL.

The page buffer sensor 702 may be coupled between the bit line coupling node BLCM and the first sensing node CSO. The page buffer sensor 702 may include the second transistor M2 that is controlled in response to a page buffer sensing signal PB_SENSE. The second transistor M2 may be implemented as an NMOS transistor that is turned on or off in response to the page buffer sensing signal PB_SENSE.

The sensing controller 703 may be coupled between the first sensing node CSO and a terminal for a core voltage VCORE. The sensing controller 703 may include the third transistor M3 that is controlled in response to a current sensing signal SA_CSOC. The third transistor M3 may be implemented as an NMOS transistor that is turned on or off in response to the current sensing signal SA_CSOC.

The precharge controller 704 may be coupled between the second sensing node SO and the terminal for the core voltage VCORE. The precharge controller 704 may include the fourth transistor M4 that is controlled in response to a precharge signal SA_PRECH_N. The fourth transistor M4 may be implemented as a PMOS transistor that is turned on or off in response to the precharge signal SA_PRECH_N.

The sensing node coupler 705 may be coupled between the second sensing node SO and the first sensing node CSO. The sensing node coupler 705 may be implemented as an NMOS transistor that is turned on or off in response to a sensing signal SA_SENSE.

The data storage 706 may be coupled between a first node QS and a second node QS_N. The data storage 706 may include a latch which stores data sensed through the bit line BL. The data storage 706 may store data determined based on the threshold voltage of the memory cell MC. The first node QS and the second node QS_N may have values inverted to each other.

The data storage reset component 707 may include the seventh transistor M7 that is controlled in response to a page buffer reset signal PBRST and the eighth transistor M8 that is controlled in response to a sensing setup signal SSET. The seventh transistor M7 may be implemented as an NMOS transistor that is turned on or off in response to the page buffer reset signal PBRST. The eighth transistor M8 may be implemented as an NMOS transistor that is turned on or off in response to the sensing setup signal SSET. In an embodiment, the data storage reset component 707 may initialize the latch included in the data storage 706. When the data storage 706 or the latch included in the data storage 706 is initialized by the data storage reset component 707, a value stored in the latch may be set to an initial value. In various embodiments, the initial value may be one of 0 and 1.

The sixth transistor M6 may be controlled in response to the potential of the first node QS. The ninth transistor M9 may be controlled in response to a sensing reset signal SRST. The tenth transistor M10 may be controlled in response to the voltage level of the second sensing node SO. The eleventh transistor M11 may be coupled between the first node QS and the second sensing node SO. The eleventh transistor M11 may be implemented as an NMOS transistor that is turned on or off in response to the voltage level of the first node QS. Also, referring to FIG. 7, the second sensing node SO may be a node which is coupled to a source terminal of the fourth transistor M4 and is also coupled to a drain terminal of the fifth transistor M5. The second sensing node SO may be a node, the voltage level of which may change depending on the result of sensing the memory cell MC. The page buffer PB1 is not limited to the embodiments illustrated in FIG. 7, and may further include additional components in addition to the existing components.

The operation of sensing the data stored in the memory cell MC may include a bit line precharge period (BL precharge), an evaluation period (EVAL), a sensing latch initialization period, and a data storage period (DATA Storing). During the BL precharge period, an operation of charging the bit line BL using charges supplied from the terminal for the core voltage VCORE may be performed. Alternatively, during the BL precharge period, an operation of applying a precharge voltage to the bit line BL may be performed. Here, the precharge voltage may be the core voltage VCORE illustrated in FIG. 7. During the evaluation period (EVAL), the memory cell MC may be turned on or off depending on the threshold voltage of the memory cell MC coupled to the bit line BL, and an operation of controlling the bit line BL so that the second sensing node SO has a voltage level corresponding to the turn-on or turn-off state may be performed. Alternatively, the evaluation period (EVAL) may be a period during which the state of the memory cell MC is incorporated into the voltage of the bit line BL. Alternatively, the evaluation period (EVAL) may be a period during which the voltage level of the bit line BL is set to a value corresponding to the threshold voltage. During the data storage period (DATA Storing), an operation of storing the result, corresponding to the voltage of the second sensing node SO that is sensed based on the threshold voltage of the memory cell MC, in the data storage 706 may be performed. During the sensing latch initialization period, an operation of initializing the value stored in the data storage 706 may be performed before the voltage value of the second sensing node SO is stored in the data storage 706. Hereinafter, the sensing latch may be identical or equivalent to the data storage 706, described above with reference to FIG. 7.

In accordance with an embodiment, the operation of initializing the sensing latch, that is, the data storage 706, may be performed during the evaluation period (EVAL).

First, before a time point T1 at which the precharge operation starts, a setup operation may be performed on the data storage 706. The operation of setting up the data storage 706 may be an operation of setting a criterion for sensing the memory cell MC. For example, it is assumed that the memory cell MC coupled to the bit line BL is a triple-level cell (TLC) and that the memory cell MC has a fifth program state PV5, among first to seventh program states PV1 to PV7, as a target program state. A verify operation of applying a verify voltage to the memory cell MC and checking whether the state of the memory cell MC has reached the fifth program state PV5 may be performed. Here, before the bit line BL is precharged, the data storage 706 may be set up. For example, the data storage 706 may be set up to a value corresponding to the fifth program state PV5 which is the target state to be verified. That is, the data storage 706 may be set up to the value that is the criterion for sensing the memory cell MC.

In an embodiment, the operation of the page buffer PB1 performed during the bit line (BL) precharge period from T1 to T2 is described as follows.

Referring to FIG. 8, the core voltage CORE is applied to the bit line BL, and thus the bit line BL may be precharged. At the time point T1, the bit line coupler 701 may be turned on in response to the bit line select signal SEL_BL that makes a transition from a logic low level to a logic high level. Also, each of the page buffer sensing signal PB_SENSE, the current sensing signal SA_CSOC, and the sensing signal SA_SENSE makes a transition from a logic low level to a logic high level, and thus the page buffer sensor 702, the sensing controller 703, and the sensing node coupler 705 may be turned on. The sixth transistor M6 may be turned or off in response to the potential of the first node QS. Further, the precharge controller 704 may be turned on in response to the transition of the precharge signal SA_PRECH_N from a logic high level to a logic low level. During the bit line (BL) precharge period, the levels of control signals applied to the above-described transistors may be maintained.

In an embodiment, the operation of the page buffer PB1 performed during the evaluation period (EVAL) from T2 to T3 is described as follows.

Referring to FIG. 8, at a time point T2, the evaluation period (EVAL) may begin. During the evaluation period (EVAL), an operation of changing or maintaining the voltage level of the second sensing node SO depending on the threshold voltage of the memory cell MC may be performed. For example, the evaluation period (EVAL) may begin in response to the operation in which the precharge signal SA_PRECH_N makes a transition from a logic low level to a logic high level and then the precharge controller 704 is turned off. Since the precharge controller 704 is turned off, a current path passing through the first transistor M1, the second transistor M2, the third transistor M3, and the fifth transistor M5 may be formed. During the evaluation period (EVAL), the voltage of the second sensing node SO may be changed, or may be maintained without change, depending on the threshold voltage of the memory cell MC coupled to the bit line BL. That is, the state of the memory cell MC may be incorporated into the voltage of the bit line BL. For example, when the threshold voltage of the memory cell MC is lower than the sensing reference voltage, the corresponding memory cell MC is determined to be an on cell, and thus a current path through the bit line BL may be formed. Therefore, charges charged in the second sensing node SO may be discharged to the bit line BL. Therefore, the voltage of the second sensing node SO may decrease. Referring to FIG. 6, in a case where the sensing reference voltage is Va, when the memory cell MC belongs to group A, the voltage of the second sensing node SO may decrease. In contrast, when the threshold voltage of the memory cell MC is higher than the sensing reference voltage, the corresponding memory cell MC is determined to be an off cell, and thus a current path through the bit line BL is not formed, and charges charged in the second sensing node SO may not be discharged. Therefore, the voltage of the second sensing node SO may be maintained without change, or may decrease only to a very slight extent. Referring to FIG. 6, in a case where the sensing reference voltage is Va, when the memory cell MC belongs to group B, the voltage of the second sensing node SO may be maintained at a high value. The evaluation period (EVAL) starting at the time point T2 may be terminated at the time point T3. For example, the evaluation period (EVAL) may be terminated in response to an operation in which the sensing signal SA_SENSE makes a transition from a logic high level to a logic low level, and then the sensing node coupler 705 is turned off.

After the evaluation period (EVAL) has been terminated, a data storage operation (DATA Storing) of sensing the voltage of the second sensing node SO and storing the result of sensing in the data storage 706 may be performed. That is, the data storage operation (DATA Storing) of storing the result of sensing the memory cell MC in the data storage 706 may be performed. Here, before the result of sensing the memory cell MC is stored in the data storage 706, an operation of initializing the data storage 706 should be essentially involved. In an embodiment, the data storage 706 may include a latch, and the latch should be initialized before the data storage operation (DATA Storing) is performed. For example, before the bit line precharge period begins, the setup operation of setting up the criterion for sensing the memory cell MC using the data storage 706 has been performed, and thus the data storage 706 is in a state in which data used for setup is stored therein. If the value of the second sensing node SO is stored in the data storage 706 without the data storage 706 being initialized, the data stored in the data storage 706 may contain unreliable data due to any value that might already be stored. Therefore, in order to store the value of the second sensing node SO in the data storage 706 without error, the data storage 706 should be initialized.

In accordance with an embodiment, the reset controller 131 described above with reference to FIG. 2 may activate the page buffer reset signal PBRST and the sensing setup signal SSET to a logic high level before the evaluation period (EVAL) is terminated, that is, during an interval from T2 to T3 in which the evaluation operation is performed. When the page buffer reset signal PBRST and the sensing setup signal SSET are activated to a logic high level after the evaluation period (EVAL) has been terminated, that is, after the time point T3, the time required for the sensing operation may be further increased.

In accordance with an embodiment, the reset controller 131, described with reference to FIG. 2, may control timing at which the data storage 706 is to be initialized. That is, the reset controller 131 may activate the page buffer reset signal PBRST and the sensing setup signal SSET during the evaluation period (EVAL). Accordingly, the data storage 706 may be initialized during the evaluation period (EVAL). That is, since the initialization operation of the data storage 706 overlaps the evaluation operation during the evaluation period (EVAL), the sensing operation may be performed faster than that in a case where the data storage 706 is initialized after the evaluation period (EVAL) has been terminated. That is, since the time required for the sensing operation of the memory device is shortened, the performance of the memory device may be improved. During the evaluation period (EVAL) (from T2 to T3), when the page buffer reset signal PBRST and the sensing setup signal SSET are activated, the first node QS of the data storage 706 may be initialized to 1, and the second node QS_N may be initialized to 0 which is a value inverted to the value of the first node QS.

Referring to FIG. 8, at the time point T3, the data storage period (DATA Storing, after T3) may begin. During the data storage period (DATA Storing), the turn-on or turn-off operation of the tenth transistor M10 may be controlled in response to the voltage level of the second sensing node SO that remains during the previously executed evaluation period (EVAL). For example, referring to FIG. 6, when the sensing reference voltage is Va, the corresponding memory cell MC may be determined to be an on cell when the memory cell MC belongs to group A. Therefore, a current path through the bit line BL is formed, and charges in the second sensing node SO are discharged, and thus the voltage level of the second sensing node SO may decrease. Here, the voltage level of the second sensing node SO may be lower than a magnitude sufficient to turn on the tenth transistor M10. Therefore, the values of the first node QS and the second node QS_N may be maintained without change. In contrast, when the memory cell MC belongs to group B in which the threshold voltage thereof is higher than the sensing reference voltage, the memory cell MC may be determined to be an off cell. Therefore, a current path through the bit line BL may not be formed. That is, charges charged in the second sensing node SO may not be discharged, and the voltage of the second sensing node SO may be maintained without change or may be decreased only to a very slight extent. Here, the voltage level of the second sensing node SO may have a magnitude sufficient to turn on the tenth transistor M10. As the tenth transistor M10 is turned on, a current path coupled to ground is formed, and thus the value of the first node QS may be inverted. Since the value of the first node QS and the value of the second node QS_N are configured to have values inverted to each other, the value of the second node QS_N may also be inverted. Since the values of the first node QS and the second node QS_N are merely exemplified for convenience of description, they are not limited to the above-described embodiments.

In accordance with an embodiment, before the period during which the data storage operation (DATA Storing) is performed begins, the initialization operation of the data storage 706 may already be performed together with the evaluation operation during the evaluation period (EVAL). Therefore, the time required for the sensing operation may be further shortened compared to a case where the data storage 706 is initialized before the data storage operation (DATA Storing) is performed after the evaluation period (EVAL) has been terminated. That is, the operating performance of the memory device may be improved.

Figure 9:
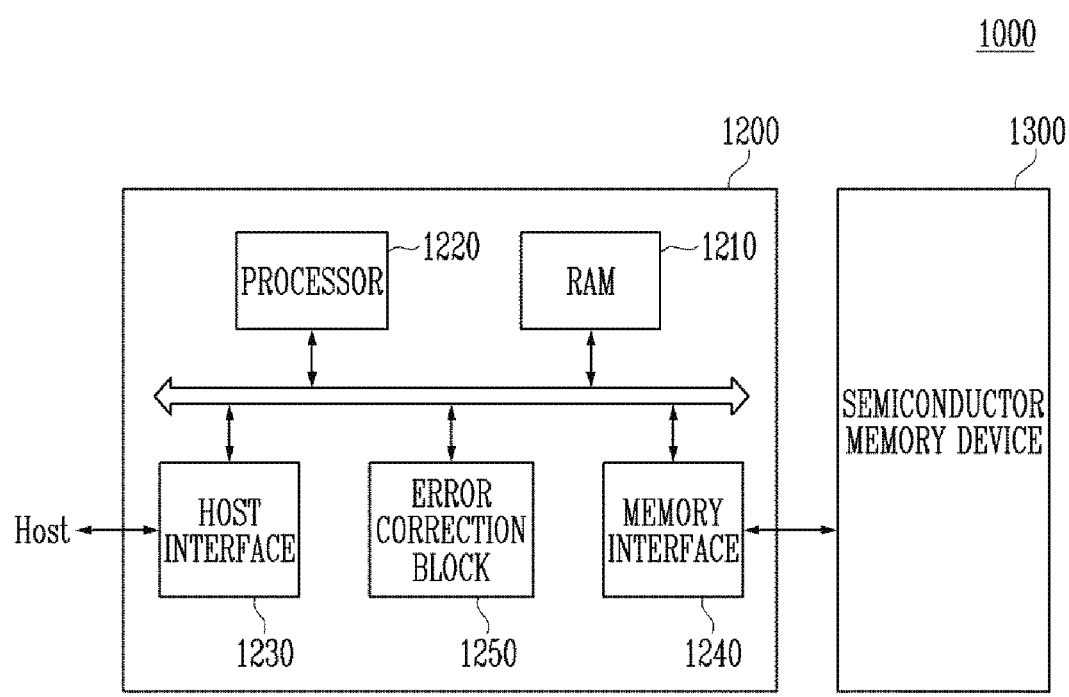
FIG. 9 is a block diagram illustrating a storage device including a memory device according to an embodiment of the present disclosure.

FIG. 9 is a block diagram illustrating a storage device including a memory device according to an embodiment of the present disclosure.

Referring to FIG. 9, a storage device 1000 includes a semiconductor memory device 1300 and a controller 1200.

The semiconductor memory device 1300 may have the same configuration and operation as the memory devices 100 described with reference to FIG. 1. Hereinafter, repetitive explanations will be omitted.

The controller 1200 is coupled to a host Host and the semiconductor memory device 1300. The controller 1200 may access the semiconductor memory device 1300 in response to a request from the host Host. For example, the controller 1200 may control read, program, erase, and background operations of the semiconductor memory device 1300. The controller 1200 may provide an interface between the semiconductor memory device 1300 and the host Host. The controller 1200 may run firmware for controlling the semiconductor memory device 1300.

The controller 1200 includes a random access memory (RAM) 1210, a processor 1220, a host interface 1230, a memory interface 1240, and an error correction block 1250.

The RAM 1210 is used as at least one of a working memory for the processor 1220, a cache memory between the semiconductor memory device 1300 and the host, and a buffer memory between the semiconductor memory device 1300 and the host.

The processor 1220 controls the overall operation of the controller 1200. The processor 1220 may control read, program, erase, and background operations of the semiconductor memory device 1300. The processor 1220 may run firmware for controlling the semiconductor memory device 1300. The processor 1220 may perform a function of a flash translation layer (FTL). The processor 1220 may translate a logical block address (LBA), provided by the host, into a physical block address (PBA) through the FTL. The FTL may receive the LBA and translate the LBA into the PBA using a mapping table. Examples of an address mapping method performed through the FTL may include various methods according to a mapping unit. Representative address mapping methods include a page mapping method, a block mapping method, and a hybrid mapping method.

The processor 1220 may randomize data received from the host Host. For example, the processor 1220 may use a randomizing seed to randomize data received from the host Host. The randomized data is provided, as data to be stored, to the semiconductor memory device 1300 and is then programmed to the memory cell array.

The processor 1220 may derandomize data received from the semiconductor memory device 1300 during a read operation. For example, the processor 1220 may use a derandomizing seed to derandomize data received from the semiconductor memory device 1300. Derandomized data may be output to the host Host.

In an embodiment, the processor 1220 may run software or firmware to perform the randomizing or derandomizing operation.

The host interface 1230 includes a protocol for performing data exchange between the host Host and the controller 1200. In an embodiment, the controller 1200 may communicate with the host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1240 may interface with the semiconductor memory device 1300. For example, the memory interface 1240 includes a NAND interface or a NOR interface.

The error correction block 1250 may detect and correct an error in data received from the semiconductor memory device 1300 using an error correction code (ECC). The error correction block 1250 may correct errors from read page data using an ECC. The error correction block 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM) or hamming code.

The controller 1200 and the semiconductor memory device 1300 may be integrated into a single semiconductor device. In an exemplary embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCMCIA), a compact flash card (CF), a smart media card (SMC), a memory stick multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD includes a storage device configured to store data in a semiconductor memory. When a memory system is used as the SSD, an operation speed of the host Host coupled to the memory system may be remarkably improved.

In an embodiment, the storage device 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional (3D) television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or one of various elements for forming a computing system.

In an example of an embodiment, the semiconductor memory device 1300 or the storage device 1000 may be embedded in various types of packages. For example, the semiconductor memory device 1300 or the storage device 1000 may be packaged and mounted in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 10:
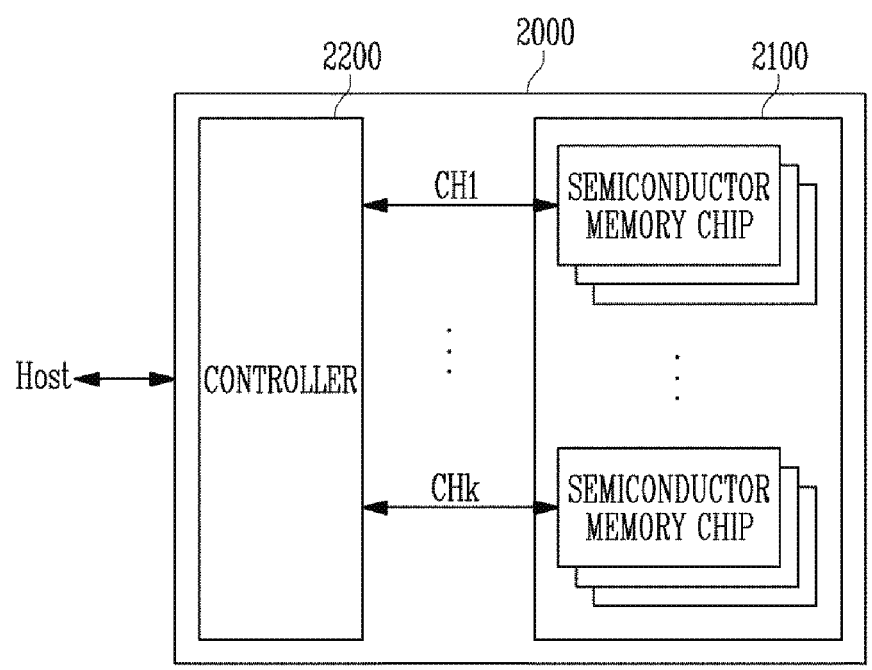
FIG. 10 is a block diagram illustrating an example of application of the storage device of FIG. 9.

FIG. 10 is a block diagram illustrating an example of a storage device 2000 and application of the storage devices of FIG. 9.

Referring to FIG. 10, a storage device 2000 includes a semiconductor memory device 2100 and a controller 2200. The semiconductor memory device 2100 may include a plurality of memory chips. The semiconductor memory chips may be divided into a plurality of groups.

In FIG. 10, it is illustrated that the plurality of groups respectively communicate with the controller 2200 through first to k-th channels CH1 to CHk. Each semiconductor memory chip may have the same configurations and operations as the memory devices 100 described with reference to FIG. 1.

Each group may communicate with the controller 2200 through one common channel. The controller 2200 may the same configurations as the controllers 1200 described with reference to FIG. 9, and may control a plurality of memory chips of the semiconductor memory device 2100 through the plurality of channels CH1 to CHk.

In FIG. 10, a plurality of semiconductor memory devices are described as being coupled to each channel. However, it will be understood that the storage device 2000 may be modified such that a single semiconductor memory device is coupled to each channel.

Figure 11:
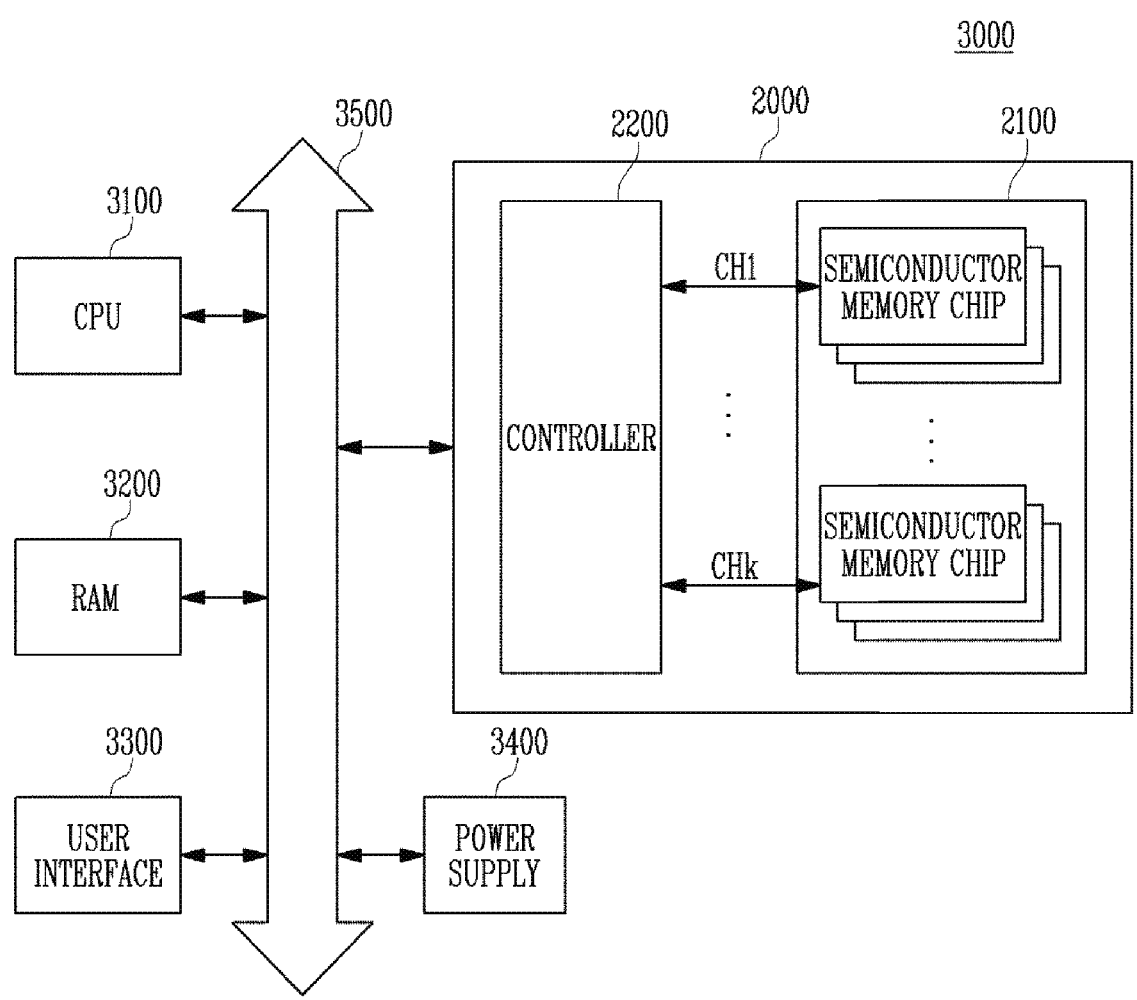
FIG. 11 is a block diagram illustrating a computing system including the storage device 2000 described with reference to FIG. 10.

FIG. 11 is a block diagram illustrating a computing system including the storage devices 2000 described with reference to FIG. 10.

Referring to FIG. 11, a computing system 3000 includes a central processing unit (CPU) 3100, a RAM 3200, a user interface 3300, a power supply 3400, a system bus 3500, and a storage device 2000.

The storage device 2000 is electrically coupled to the CPU 3100, the RAM 3200, the user interface 3300, and the power supply 3400 through the system bus 3500. Data provided through the user interface 3300 or processed by the CPU 3100 may be stored in the storage device 2000.

In FIG. 11, a semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 11, the storage device 2000 described with reference to FIG. 10 is illustrated as being provided. However, the storage device 2000 may be replaced with the storage devices 1000 described with reference to FIG. 9. In an embodiment, the computing system 3000 may include both the storage devices 1000 and 2000 described with reference to FIGS. 9 and 10.

In accordance with embodiments of the present disclosure, there are provided a memory device having improved read performance of memory cells and a method of operating the memory device.

What is claimed is:
1. A memory device, comprising:
a memory cell;
a page buffer coupled to the memory cell through a bit line and configured to perform a read operation of sensing data stored in the memory cell; and
a reset controller configured to control a signal that is applied to the page buffer,
wherein the page buffer comprises:
a data storage configured to store data sensed from the memory cell,
wherein the read operation includes a precharge period during which a precharge voltage is applied to the bit line and an evaluation period during which a state of the memory cell is reflected into a voltage of the bit line, and
wherein the reset controller is configured to control the data storage so that the data storage is initialized during the evaluation period.

2. The memory device according to claim 1, wherein the read operation includes a data storage period during which the data sensed through the bit line is stored in the data storage.

3. The memory device according to claim 2, wherein:
the page buffer comprises:
a bit line coupler coupled between the bit line and a bit line coupling node;
a page buffer sensor coupled between the bit line coupling node and a first sensing node; and
a sensing controller coupled between the first sensing node and a core voltage terminal, and
each of the bit line coupler, the page buffer sensor, and the sensing controller comprises a transistor that is turned on during performance of the read operation.

4. The memory device according to claim 3, wherein:
the page buffer further comprises a sensing node coupler coupled to the first sensing node, and
the sensing node coupler comprises a transistor that is turned on during the precharge period and the evaluation period.

5. The memory device according to claim 4, wherein:
the page buffer further comprises a precharge controller coupled to the sensing node coupler, and
the precharge controller comprises a transistor that is turned on during the precharge period and is turned off during the evaluation period.

6. The memory device according to claim 5, wherein:
the page buffer further comprises a second sensing node coupling the precharge controller to the sensing node coupler, and
the sensed data is stored in the data storage depending on a potential of the second sensing node.

7. The memory device according to claim 2, wherein:
the page buffer comprises a data storage reset component configured to initialize the data storage, and
the reset controller activates a page buffer reset signal that is applied to the data storage reset component during the evaluation period.

8. The memory device according to claim 7, wherein:
the data storage comprises a latch circuit configured to store data, and
the latch circuit is initialized in response to application of the page buffer reset signal.

9. The memory device according to claim 5, wherein the data storage is initialized while the sensing node coupler is turned on and the precharge controller is turned off.

10. The memory device according to claim 9, wherein:
the page buffer further comprises a data storage reset component configured to initialize the data storage, and
the reset controller activates a page buffer reset signal that is applied to the data storage reset component in a state in which the sensing node coupler is turned on.

11. The memory device according to claim 10, wherein the reset controller activates the page buffer reset signal in a state in which the precharge controller is turned off.

12. A method of operating a memory device, the memory device including a memory cell and a page buffer coupled to the memory cell through a bit line, the method comprising:
performing a precharge operation of applying a precharge voltage to the bit line;
performing an evaluation operation of incorporating a state of the memory cell into a voltage of the bit line; and
performing a data storage operation of storing sensed data corresponding to the state of the memory cell in a data storage included in the page buffer,
wherein, at performing the evaluation operation, the data storage is initialized.

13. The method according to claim 12, wherein:
the page buffer comprises:
a bit line coupler coupled between the bit line and a bit line coupling node;
a page buffer sensor coupled between the bit line coupling node and a first sensing node; and
a sensing controller coupled between the first sensing node and a core voltage terminal, and
the precharge operation is performed such that a transistor included in each of the bit line coupler, the page buffer sensor, and the sensing controller is turned on.

14. The method according to claim 13, wherein:
the page buffer further comprises:
a sensing node coupler coupled to the first sensing node; and
a precharge controller coupled to the sensing node coupler,
the precharge operation is performed such that a transistor included in the sensing node coupler is turned on and a transistor included in the precharge controller is turned on.

15. The method according to claim 14, wherein the evaluation operation performed such that the transistor included in the sensing node coupler is turned on and the transistor included in the precharge controller is turned off.

16. The method according to claim 14, wherein:
the page buffer further comprises a second sensing node coupling the precharge controller to the sensing node coupler, and
the data storage operation is performed to store a value corresponding to a voltage level of the second sensing node in the data storage.

17. The method according to claim 15, wherein:
the page buffer further comprises a data storage reset component configured to initialize the data storage, and
the evaluation operation is performed to activate a signal that is applied to the data storage reset component.

18. The method according to claim 17, wherein the signal initializes the data stored in the data storage.

19. A storage device, comprising:
a memory device including a memory cell; and
a memory controller configured to control an operation of the memory device,
wherein the memory device comprises a latch configured to perform a sensing operation of sensing data stored in the memory cell and then store a result of sensing, and
wherein the sensing operation comprises an operation of applying a precharge voltage to a bit line coupled to the memory cell, incorporate a state of the memory cell into a voltage of the bit line, and initializing the latch while the state of the memory cell is reflected into the voltage of the bit line.

20. The storage device according to claim 19, wherein:
the memory device further comprises a latch reset component configured to initialize the latch, and
the latch reset component is configured such that an activation signal is applied while the state of the memory cell is reflected into the voltage of the bit line.

* * * * *